(12) United States Patent
Koch et al.

(10) Patent No.: US 7,675,304 B2
(45) Date of Patent: *Mar. 9, 2010

(54) PROBE ASSEMBLY WITH MULTI-DIRECTIONAL FREEDOM OF MOTION AND MOUNTING ASSEMBLY THEREFOR

(75) Inventors: Alexander Koch, Kitchener (CA); Arkady Ivannikov, Mississauga (CA); Ted Toth, Kitchener (CA)

(73) Assignee: Research In Motion Limited, Waterloo, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/360,323

(22) Filed: Jan. 27, 2009

(65) Prior Publication Data

US 2009/0134899 A1     May 28, 2009

Related U.S. Application Data

(63) Continuation of application No. 11/780,913, filed on Jul. 20, 2007, now Pat. No. 7,501,841, which is a continuation of application No. 11/051,012, filed on Feb. 4, 2005, now Pat. No. 7,268,567.

(51) Int. Cl.
*G01R 31/02* (2006.01)
(52) U.S. Cl. .................................. 324/754; 324/761
(58) Field of Classification Search ................ None
See application file for complete search history.

(56) References Cited

U.S. PATENT DOCUMENTS

| 3,537,000 | A |   | 10/1970 | Easi |  |
|---|---|---|---|---|---|
| 3,851,249 | A |   | 11/1974 | Roch |  |
| 4,301,338 | A |   | 11/1981 | McMurtry |  |
| 4,462,162 | A |   | 7/1984 | McMurtry |  |
| 4,523,063 | A |   | 6/1985 | Kroetsch |  |
| 4,581,826 | A | * | 4/1986 | Ernst | .......................... 33/503 |

(Continued)

FOREIGN PATENT DOCUMENTS

EP      1304770 A2     4/2003

(Continued)

OTHER PUBLICATIONS

Aries Electronics, Inc., "Aries Now Offers New RF Center Probe Text Socket with Floating Guide Plate," pp. 1-2.

(Continued)

*Primary Examiner*—Vinh P Nguyen
(74) *Attorney, Agent, or Firm*—Grant E. Coffield; Brij K. Agarwal; Eckert Seamans Cherin & Mellott, LLC

(57) ABSTRACT

An improved test probe assembly has an improved mounting assembly which provides the test probe multi-directional freedom of movement with respect to a base in order to resist damage frequently caused to the test probe. The improved mounting assembly may, for example, include at least a first resilient mount disposed on the base and having at least a first support and at least a first resilient element. The at least a first resilient element, which may, for example, be at least a first spring, is deflectable when the test probe engages a structure, such as a device under testing (DUT). Accordingly, the improved test probe assembly of the invention can be deflected an infinite number of positions, in order to resist damage caused, for example, by misalignment between the probe and the DUT.

14 Claims, 3 Drawing Sheets

U.S. PATENT DOCUMENTS

| | | |
|---|---|---|
| 5,008,615 A | 4/1991 | Littlebury |
| 5,160,918 A | 11/1992 | Saposnik et al. |
| 5,395,253 A | 3/1995 | Crumly |
| 5,505,005 A * | 4/1996 | McMurtry et al. ............ 33/561 |
| 5,672,977 A | 9/1997 | Yamada |
| 5,914,613 A | 6/1999 | Gleason et al. |
| 6,224,407 B1 | 5/2001 | Duquerroy et al. |
| 6,281,690 B1 | 8/2001 | Frey |
| 6,422,886 B1 | 7/2002 | Macbeth et al. |
| 7,501,841 B2 * | 3/2009 | Koch et al. .................. 324/754 |
| 2003/0222667 A1 | 12/2003 | Khandros, Jr. et al. |

OTHER PUBLICATIONS

Aries Electronics, Inc., "RF Centre Probe Socket has Floating Guide Plate," Aug. 18, 2003, pp. 1-2.

Murata Manufacturing Co., Ltd., "Microwave Coaxial Connectors," Jun. 2001, pp. 1-9.

* cited by examiner

PROBE ASSEMBLY WITH MULTI-DIRECTIONAL FREEDOM OF MOTION AND MOUNTING ASSEMBLY THEREFOR

CROSS-REFERENCE TO RELATED APPLICATIONS

This is application is a continuation of U.S. application Ser. No. 11/780,913 entitled "PROBE ASSEMBLY WITH MULTI-DIRECTIONAL FREEDOM OF MOTION AND MOUNTING ASSEMBLY THEREFOR," filed Jul. 20, 2007, now U.S. Pat. No. 7,501,841, which is a continuation of U.S. application Ser. No. 11/051,012, filed Feb. 4, 2005, now U.S. Pat. No. 7,268,567.

BACKGROUND OF THE INVENTION

1. Field of the Invention

The invention relates generally to testing of electronic devices and, more particularly, to a mounting assembly for a test probe which allows multi-directional freedom of motion of the test probe. The invention also relates to a test probe assembly.

2. Background Information

Numerous types of handheld electronic devices are known. Examples of such devices include, for instance, personal data assistants (PDAs), handheld computers, two-way pagers, cellular telephones, and the like. Many handheld electronic devices feature wireless communication capability, although many such handheld electronic devices are stand-alone. In order to assure proper operation, the handheld electronic devices are typically tested as part of their assembly process.

The tests which are conducted on the handheld electronic device often include a test of radio frequency (RF) features and related circuitry of the device. As is known in the art, RF devices enable, among other things, the wireless communication capabilities of the handheld electronic device. Other radio communications enabled by RF devices include, without limitation, navigation communications, satellite communication and navigation and telecommunications, antenna communications, and the like. Testing of handheld electronic device RF features is typically accomplished by way of a switch and probe.

FIGS. 1 and 2 show a representative example of a probe 2, which may be an RF probe, and a switch 4 for testing the wireless communication features of the handheld electronic device (not shown). The probe 2 includes an elongated body 6 with a first, switch engaging end 8, a second end 10 and a mounting plate 12 fixed to the body 6 proximate the second end 10. In the example of FIG. 1, the second end 10 includes a receptacle for connection to, for example, a coaxial cable (not shown). The first end 8 includes a spring-loaded retractable portion 14 having a switch-actuating probe, or wire 16 (FIG. 2). In operation, the retractable portion 14 retracts into the elongated body 6 upon engaging the switch 4 (best shown in FIG. 2), thereby enabling insertion of the wire 16 into the switch 4. The switch 4 may be mounted, on a printed circuit board (PCB) 18, as shown in FIG. 2. The switch 4 includes a receptacle 20 with sloped walls 22, 24 for guiding the probe wire 16 into the switch 4 in order to engage and open a movable contact 26 (FIGS. 3A and 3B).

FIGS. 3A and 3B generally show the movable contact 26 of switch 4. FIG. 3A shows the movable contact 26 in the closed position, while FIG. 3B shows the movable contact 26 in the open position after having been engaged by the probe wire 16. As shown, engaging and opening the switch 4 with the probe wire 16 breaks the circuit, isolating portions of the circuit or device for independent testing.

The probe 2 may be mounted in a stationary position or, alternatively, may be mounted on a robotic arm (not shown) or other suitable movable member. For example, in certain testing circumstances, a series of at least partially assembled handheld electronic devices (not shown) is fed down an assembly line (not shown), with each electronic device stopping at a number of stations including, for example, an RF testing station, in order to be tested one at a time. At the testing station, the probe 2 would be moved to engage the switch 4, which is coupled to the handheld electronic device. In either mounting configuration, the probe 2 is substantially rigid. The rigid manner in which the probe 2 are mounted often results in the probe 2 becoming damaged during a testing sequence.

Specifically, the probe 2 is typically rigidly mounted to the stationary structure or the robotized structure (not shown) by fasteners, such as screws (not shown), which are inserted through holes 28,30 in the mounting plate 12. Such rigid mounting of the probe 2 neglects to provide sufficient freedom of movement of the probe 2 and, therefore, renders the probe incapable of accommodating misalignment between the probe 2 and the device under test (DUT) and, more particularly, misalignment between the switch 4 on the DUT, and the probe 2. Due to the small size of the components involved, i.e., the switch 4, the probe 2 and, in particular, the wire 16, misalignment can easily occur, and in fact, frequently does occur. The small and thus fragile nature of the probe wire 16 renders it particularly susceptible to damage during testing sequences. Specifically, when misaligned, as shown in FIG. 2, the probe wire 16 bends (not shown) upon hitting an adjacent portion of the switch 4 (e.g., sloped side walls 22,24). Although the rectractable portion 14 of the probe 2 includes a conical shaped recess 32 having sloped sides 34,36 which are adapted to assist in centering the probe 2, perfect alignment and insertion of the probe wire 16 through the center of the switch receptacle 20 is seldom achieved. The rigid nature of the probe 2, therefore, tends to result in the misaligned wire 16 being bent. Bending the wire 16 can damage (e.g., yield) and even break it. Bending also creates problems when the wire 16 is retracted following testing and when an attempt is made to re-aim the wire 16 during a subsequent testing sequence.

There is a need, therefore, for a probe mounting assembly and probe capable of accommodating misalignment between the probe and the DUT, and for an associated method of employing the probe.

SUMMARY OF THE INVENTION

An improved test probe mounting assembly resists damage frequently caused to the probe during, for example, a testing sequence on a device under testing (DUT). By providing to the test probe multi-directional freedom of movement with respect to a base of the mounting assembly, the improved mounting assembly and test probe accommodate misalignment between the probe and the DUT.

Accordingly, an aspect of the invention is to provide an improved mounting assembly for allowing a test probe to, through multi-directional freedom of movement, facilitate alignment of the probe with the DUT and, therefore, reduce the possibility of bending or otherwise damaging a portion of the probe.

Another aspect of the invention is to provide an improved test probe assembly that, in response to being misaligned with the DUT, moves in accordance with one or more of a plurality of directions of freedom of movement before yielding or fracture of the test probe occurs.

Another aspect of the invention is to provide an improved mounting assembly with at least a first resilient mount for providing multi-directional freedom of movement of the test probe.

Another aspect of the invention is to provide an improved mounting assembly for a test probe of the type used to test an electronic device, in which the general nature of the mounting assembly can be stated as including a base and at least a first resilient mount disposed on the base, the at least a first resilient mount being structured to receive the test probe thereon and to be at least partially deflectable to allow multi-directional freedom of movement of the test probe with respect to the base. The at least a first support may include a spacer and a shoulder, the spacer being disposed on the base, and the shoulder being disposed on the spacer, the at least a first resilient element being disposed on one of the base and the shoulder and being structured to bias at least a portion of the test probe toward the other of the base and the shoulder. The at least a first support may include a first support and a second support, wherein the spacers of the first and second supports are structured to extend through first and second openings of an attachment member of the test probe. The at least a first resilient element may include a first resilient element and a second resilient element, the first and second resilient elements being independently deflectable to provide the multi-directional freedom of movement. The spacer may be a smooth shank, the shoulder being disposed at an end of the smooth shank, wherein the smooth shank is structured to be movably disposed within an opening of an attachment member of the test probe.

Another aspect of the invention is to provide an improved probe assembly, the general nature of which can be stated as including a test probe comprising an elongated body and an attachment member, the body being disposed on the attachment member, and a mounting assembly comprising a base, and at least a first resilient mount disposed on the base, the test probe being disposed on the at least a first resilient mount, the at least a first resilient mount being deflectable to allow multi-directional freedom of movement of the test probe with respect to the base. The at least a first resilient mount may include a first support and a second support that each include a smooth shank and a shoulder, a first resilient element having a through bore and a second resilient element having a through bore, wherein the smooth shanks of the first and second supports are disposed within the through bores of the first and second resilient elements, and wherein the first and second resilient elements bias the attachment member of the test probe toward the shoulders of the first and second supports and are independently deflectable to provide the multi-directional freedom of movement of the attachment member upon the smooth shanks. The test probe may be movable with respect to the base of mounting assembly in at least a first direction and a second direction, wherein in the first direction, the test probe is movable generally perpendicularly toward the base and wherein in the second direction, the test probe is pivotable to a position which is not perpendicular with respect to the base. The test probe may also be movable in a third direction with respect to the base, the third direction including transverse movement of the attachment member between the smooth shanks of the first and second supports. The first and second resilient elements may be movable between an undeflected position and a plurality of deflected positions wherein both of the first and second resilient elements being disposed in substantially the same deflected position of the plurality of deflected positions provides the movement in the first direction, and wherein each of the first and second resilient elements being disposed in a different one of the undeflected position and the plurality of deflected positions provides the movement in the second direction.

BRIEF DESCRIPTION OF THE DRAWINGS

A full understanding of the invention can be gained from the following Description of the Preferred Embodiments when read in conjunction with the accompanying drawings in which.

Similar numerals refer to similar parts throughout the specification.

DESCRIPTION OF THE PREFERRED EMBODIMENTS

Figure 1:
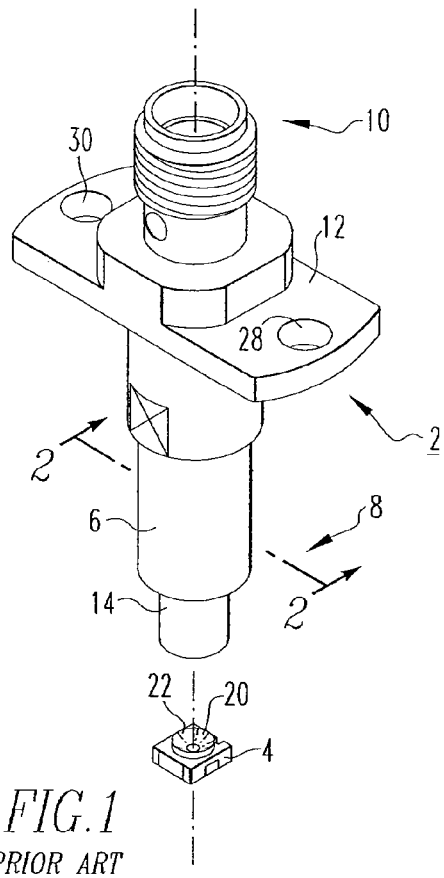
FIG. 1 is a perspective view of a prior art probe and a RF switch before being engaged and actuated by the probe.

For purposes of illustration, the invention will be described as applied to a radio frequency (RF) probe for engaging and actuating an associated switch to test RF circuits and features of a handheld electronic device. However, it will become apparent that the invention could also be applied to any other known or suitable type of probe and switch for testing a wide variety of circuits, systems and features of any electronic device.

Directional phrases used herein, such as, for example, left, right, clockwise, counterclockwise, up, down and derivatives thereof, relate to the orientation of the elements shown in the drawings and are not limiting upon the claims unless expressly recited therein.

As employed herein, the term "fastener" refers to any suitable connecting or tightening mechanism expressly including, but not limited to, screws, bolts and the combinations of bolts and nuts (e.g., without limitation, lock nuts) and bolts, washers and nuts. For example, the exemplary fastener shown and discussed herein is a shoulder screw, although any other suitable fastener could alternatively be employed.

Figure 4:
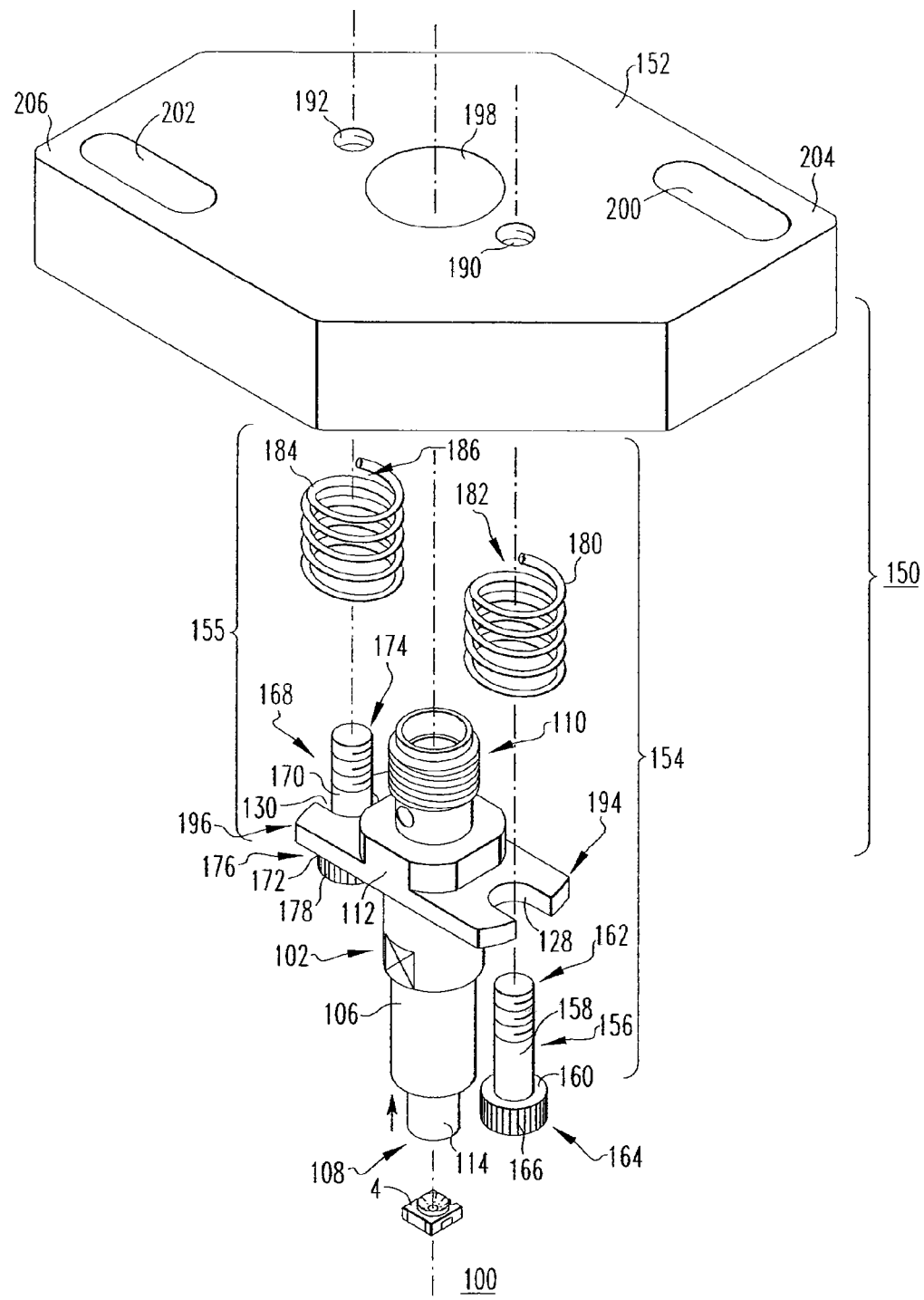
FIG. 4 is an exploded, perspective view of a probe assembly including a mounting assembly for providing multi-directional freedom of movement of the test probe in accordance with the invention, and a switch.
Figure 5:
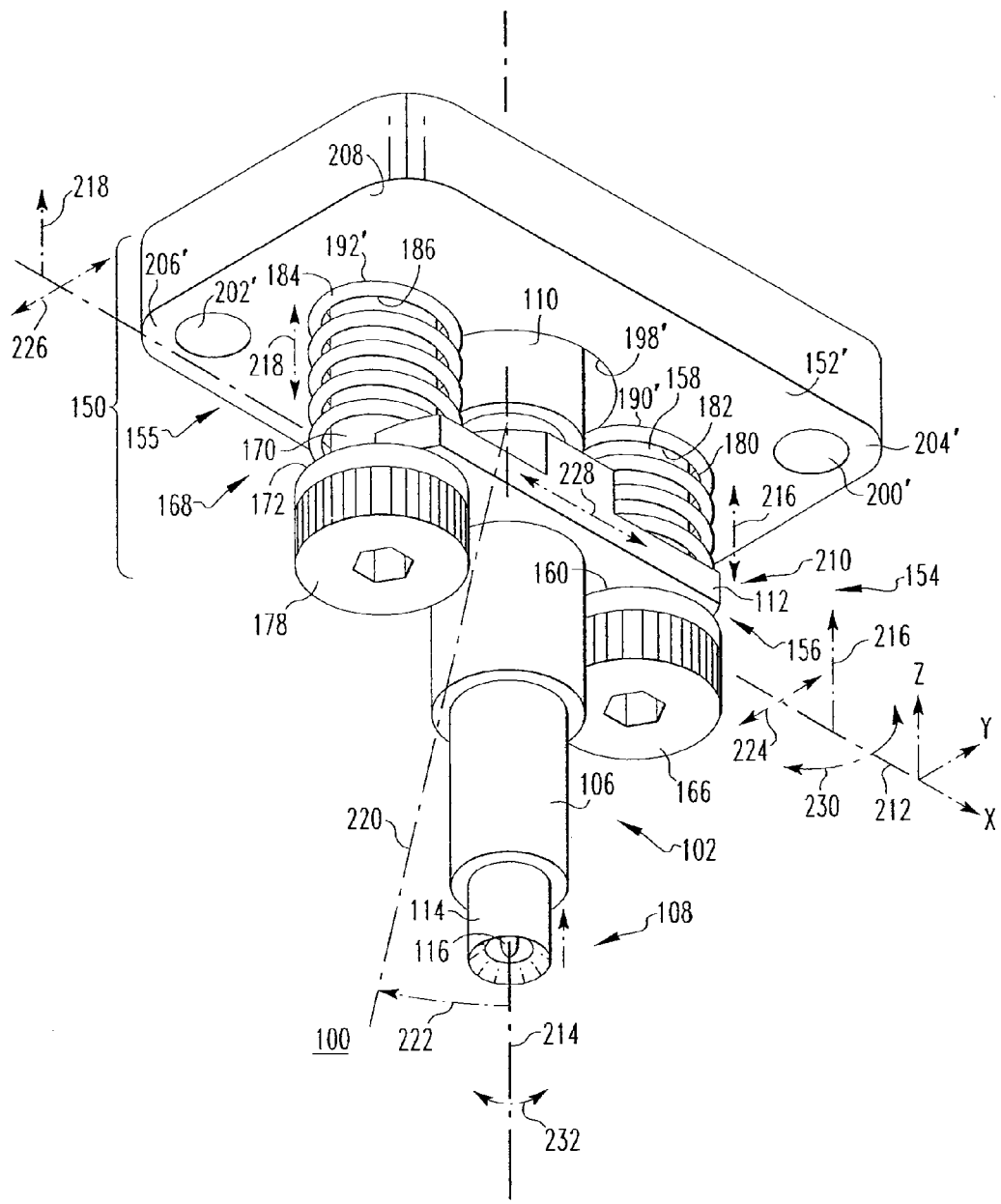
FIG. 5 is a perspective, assembled view of the probe assembly of FIG. 4, modified to employ a different base in accordance with another embodiment of the invention.

FIG. 4 shows an improved probe assembly 100 in accordance with the invention. The probe assembly 100 includes an improved mounting assembly 150 in accordance with the invention that is depicted in FIGS. 4-5. More particularly, the probe assembly 100 includes the test probe 102 and the mounting assembly 150 which has a base 152 and at least a first resilient mount 154 disposed on the base 152. Two resilient mounts 154,155 are shown in the examples of FIGS. 4 and 5, although a single resilient mount configuration (not shown) or any suitable configuration having more than two resilient mounts (not shown), could also be employed. As will be described in further detail herein, the at least a first resilient mount (e.g., 154,155) is deflectable to allow multi-directional freedom of movement of the test probe 102 with respect to the base 152. The phrase "multi-directional freedom of movement," as used herein, refers to the ability of the test probe 10, as provided by the mounting assembly 150 of the invention, to move in a plurality of directions with respect to the base 152 and will be more fully understood with reference to FIG. 5, as described hereinbelow.

Figure 2:
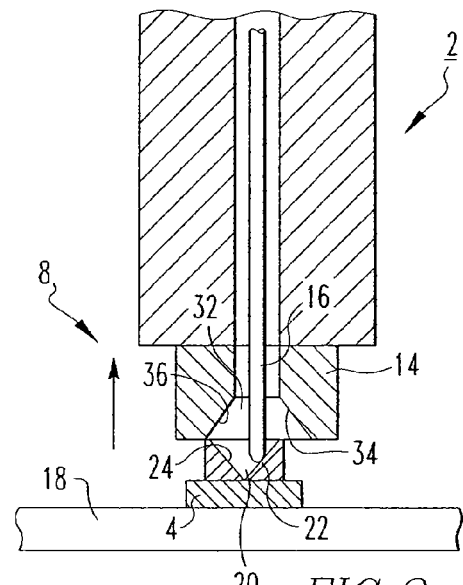
FIG. 2 is a cross-sectional view taken along line 2-2 of FIG. 1, showing the switch-engaging end of the probe as it engages the RF switch, which is misaligned with respect to the probe wire.

The exemplary test probe 102 is an RF probe 102 much like the RF probe 2 illustrated and describe previously in connection with FIGS. 1 and 2. Such probes are commonly referred to in the art as microwave coaxial connectors and are commercially available from Murata Electronics North America, Inc. of 2200 Lake Park Drive, Smyrna, Ga. Similarly, the switch 4, commonly referred to as a SWD type switch, which is compatible with the probe 102 is also available from Murata Electronics. The foregoing probe, switch combination is commonly used, for example, for characteristic measurement of handheld telephone and microwave circuits and is, therefore, ideal for use in testing RF systems of handheld electronic devices (not shown). It will, however, be appreciated that the mounting assembly 150 of the invention could alternatively be employed with any known or suitable probe other than the one shown and described herein.

Figure 3A:
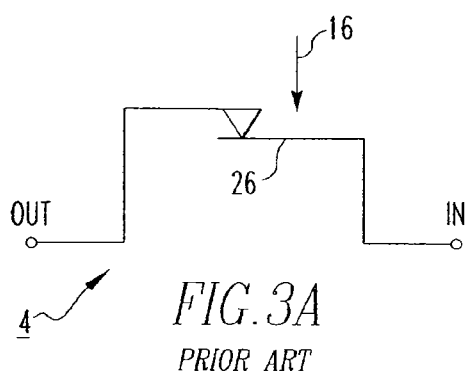
FIG. 3A is a schematic view of the RF switch of FIG. 1 before being engaged by the probe.
Figure 3B:
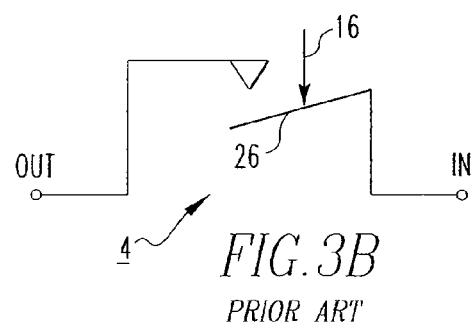
FIG. 3B is a schematic view of the RF switch of FIG. 1 after being engaged and actuated by the probe.

As shown in FIG. 4, like probe 2 of FIGS. 1-3, probe 102 has an elongated body 106 with a first, switch-engaging end 108, a second end 110 and an attachment member 112 disposed proximate the second end 110. The first end 108 also includes the same retractable portion 114 which retracts into the body 106 to expose the switch-actuator, or wire 116. Accordingly, probe 102 and the features thereof may be identical to probe 2 (FIGS. 1-3) or one or more features of the probe 102 may be different. For example, the exemplary attachment member 112 has been modified, in comparison to mounting plate 12 of FIGS. 1 and 2, to create first and second slots 128,130 in place of the first and second holes 28,30 (FIGS. 1-2). While the exemplary slots 128,130 function to facilitate the multi-directional freedom of movement of the probe 2 with respect to the base 150, it is understood that the probe 2 of FIGS. 1 and 2 could also be employed with the mounting assembly 150, without this or any other modification.

The exemplary probe 102 is disposed on first and second resilient mounts 154,155. Each resilient mount 154,155 includes at least a first support 156,168 disposed on the base 152 (best shown in FIG. 5) and at least a first resilient element 180,184. The example shown and described herein includes first and second supports 156,168 and first and second resilient elements 180,184. However, any suitable number of supports and resilient elements, in any suitable configuration, could alternatively be employed without departing form the concept of the invention. For simplicity of disclosure, only one support 156 will be described in detail, as the other support 168 is essentially identical in structure. The support 156 includes a spacer 158 and a shoulder 160, the spacer 158 being disposed on the base 152 and the shoulder 160 being disposed on the spacer 158, as shown in FIG. 5. The resilient element 182,184 is disposed on the base 152 and biases at least a portion of the test probe 102 toward the shoulder 160. It will be appreciated, however, that the resilient element 182,184 could alternatively be disposed on the shoulder 160 and bias at least a portion of the test probe 102 toward the base 152.

In a preferred embodiment of the invention, shown in FIGS. 4 and 5, spacers 158,170 of first and second supports 156,168 are disposed in first and second openings (e.g., first and second slots 128,130) of the test probe attachment plate 112. In this embodiment, the at least a first resilient element includes first and second resilient elements, such as the exemplary first and second linear springs 180,184, shown. Each linear spring 180,184 has a through bore 182,186 through the center of the spring coils. Of course, other known or suitable types of resilient elements (not shown) could be employed. Similarly, as best shown in FIG. 4, the exemplary supports 156,168 are threaded fasteners each having a first threaded end 162,174 and a second end 164,176 with an enlarged head 166,178 having the shoulder 160,172, wherein the spacer of each fastener 156,168 is a generally smooth shank 158,170 between the shoulder 160,172 and the threaded first end 162, 174. However, any known or suitable alternative support or fastener could be employed.

As best shown in FIG. 5, the smooth shanks 158,170 of the exemplary threaded fasteners 156,168 are disposed in the slots 128,130 (FIG. 4) of the test probe attachment member 112 and extend through the through bores 182,186 of the first and second exemplary linear springs 180,184. The threaded first ends 162,174 (FIG. 4) of the exemplary first and second fasteners 156,168 are threadingly secured within corresponding first and second threaded apertures 190,192 (FIG. 4) in the base 152. In this manner, the exemplary resilient mounts 154,155 are retained on the base 152, such that the first and second springs 180,184 bias the attachment member 112 of the test probe 102 toward the shoulders 160,172 of the fasteners 156,168. The first and second resilient elements (e.g., linear springs 180,184) are, therefore, independently deflectable to provide the multi-directional freedom of movement of the attachment member 112 upon the smooth shanks 158,170.

The base 152 of the mounting assembly 150 may be made from any known or suitable material and may be configured in any suitable manner in order to accommodate one or more resilient mounts (e.g., 154,155) in accordance with the invention. For example, two different bases 152 and 152' are shown in FIGS. 4 and 5, respectively, while all other components of the test probe assembly 150, other than the biases 152,152', are the same.

In the examples of FIGS. 4 and 5, both bases, 152 (FIG. 4) and 152' (FIG. 5), have first and second threaded apertures 190,192; 190', 192' which are generally aligned with the openings (e.g., slots 128,130 (FIG. 4)) of the test probe attachment member 112. This is in order to facilitate movement of the ends 194,196 of the attachment member 112 upon the smooth shanks 158,170 of the first and second fasteners 156,168. Movement of the ends 194,196 may occur either independent or simultaneous. Both bases, 152 (FIG. 4) and 152' (FIG. 5), also include an oversized aperture 198 (FIG. 4), 198' (FIG. 5) which receives a portion (e.g., second end 110) of the elongated body 106 of the test probe 102 and allows the multi-directional freedom of movement of the test probe 102 with respect to the base 152,152'. The oversized aperture 198,198' also provides access to the second end 110 of the probe 102 in order to, for example, connect a coaxial cable (not shown) thereto. Additionally, bases 152,152' both include a number of mounting apertures (e.g., 200,202 of FIG. 4; 200',202' of FIG. 5). It will be appreciated that these mounting apertures may be of any suitable number and configuration necessary for connection of the mounting assembly 150 to a separate structure (e.g., a stationary element or a robotized piece of testing equipment (not shown)). For example, base 152 of FIG. 4 includes a pair of elongated openings 200,202 through opposing corners 204,206 of the base 152, while base 152' of FIG. 5 includes a pair of through holes 200',202' proximate opposing corners 204',206'. It is understood that the slots 200,202 (FIG. 4) and 200',202' (FIG. 5) are intended to receive fasteners (not shown) or any other known or suitable fastening mechanism structured to secure the entire test probe assembly 100 to the separate structure. Such fastening mechanism may include, without limitation, a portion of the separate structure (not shown) which is structured to be inserted into the mounting apertures 200,202; 200',202' to secure the base 152,152' thereto.

It will be appreciated that the base (e.g., 152,152') may be any suitable size and shape. For example, base 152' of FIG. 5 is generally rectangular in shape, having four corners 204', 206', 208 and 210 (partially hidden behind fastener 156 of FIG. 5). However, the base 152 of FIG. 4 has been modified to remove corners 208 and 210. Such a modification might be made, for example, to permit a variety of different mounting orientations of the test probe assembly 100. It will further be appreciated that, while the exemplary bases 152,152' shown and described herein are contemplated as being made from FR-4, commonly referred to as G-10, and to have a thickness of about 3/16 inches, that any know or suitable alternative material of any suitable thickness, could be employed. G-10 is a rigid, wear resistant material commonly used to make printed circuit boards (PCBs).

Accordingly, in view of the foregoing, it can be appreciated that the mounting assembly 150 of the invention can be fashioned economically from existing or readily available components (e.g., springs; shoulder screws), can be readily employed with a wide variety of existing probe types, and can be easily adapted for use with many different types of testing equipment (not shown).

Continuing to refer to FIG. 5, the multi-directional freedom of movement provided by the mounting assembly 150 of the invention, will now be described in greater detail. As previously discussed, "multi-directional freedom of movement," as used herein, refers to the ability of the test probe 102, as provided by the mounting assembly 150 of the invention, to move among an infinite number of directions and positions with respect to the base 152, 152'. Specifically, the test probe assembly 100 of the invention is resilient as opposed to being rigidly mounted. Therefore, upon engaging a structure, such as the RF switch 4 (FIG. 4) of a DUT, if the switch 4 is not perfectly aligned with the switch actuator, or wire 116 (FIG. 5) of the probe 102 (see, e.g. misaligned probe 2 and switch 4 of FIG. 2), the exemplary probe 102, by way of the mounting assembly 150 of the invention, will deflect as necessary to accommodate the misalignment and, more importantly, to avoid bending the wire 116. In other words, the resilient mounts (e.g., 154,155) of the invention advantageously provide the exemplary probe 102 with "play" during probing operations. Thus, the probe 102 is provided with the aforementioned multi-directional freedom of movement not only during engagement between the DUT and the probe 102, but also throughout the duration of the probing operation. This is a significant improvement over other probes and probing systems which, at best, have employed a test socket having a floating guide plate which is intended to protect the probe while it is at rest. Floating guide plates are mountable, for example, onto a load board (e.g., a PCB). However, such guide plates not only represent an entirely different concept, but they also fail to address the rigid and thus problematic nature of the probe mount. Accordingly, the invention provide a significant improvement which overcomes the known disadvantages (e.g., damaged and broken probe wires) of other test probes (e.g., probe 2 of FIGS. 1-2).

More specifically, the test probe 102 is movable with respect to the base 152' of the mounting assembly 150 in an infinite number of directions. For simplicity of disclosure, these infinite directions will be broadly characterized into first, second, and third directions. To help depict these directions of movement, a X,Y,Z Cartesian coordinate key and two axes 212,214 have been added to FIG. 5. The first axis 212 is aligned with the X-direction. The second axis 214 is aligned with the Z-direction. The first direction is indicated generally by arrows 216 and 218, which represent movement of the test probe 102 which is generally toward the base 152' (e.g., up and down in the Z-direction, with respect to FIG. 5). Each of the resilient elements (e.g., springs 180,184) is movable between an undeflected position (shown in FIG. 5) and a plurality of deflected positions (not shown) to provide this and other movements of the probe 102. Accordingly, in the example shown, it will be understood that movement in the first direction is provided by deflection of both springs 180, 184 between the undeflected position and substantially the same deflected position of the plurality of deflected positions. Such movement would entail both ends 194,196 (FIG. 4) of the test probe attachment member 112, and thus the test probe 102, moving substantially the same distance toward the base 152' in the direction indicated by arrows 216 and 218.

As previously discussed, the springs 180,184 are also independently deflectable in the direction indicated by arrows 216 and 218. Thus, a second direction of movement with respect to the base 152' can be achieved wherein the test probe 102 pivots to one of an infinite number of positions in which the probe 102 is translatable, or pivoted, with respect to the base 152'. One example of such a pivoted (e.g., without limitation, non-perpendicular) test probe position is indicated generally by dashed line 220 of FIG. 5 which represents the test probe having been pivoted with respect to the base 152', in the direction of arrow 222. It will be understood that such movement in the second direction corresponds to the first spring 180 being disposed in a different one of the undeflected position and the plurality of deflected positions than the second spring 184. It will further be understood that the foregoing example (e.g., dashed line 220) is but one of an infinite number of possible probe positions.

The test probe 102 is further movable in at least a third direction with respect to the base 152'. The third direction includes transverse movements of the test probe attachment member 112, for example, between the smooth shanks 158, 170 of the exemplary first and second fasteners 156,168. The exemplary slots 128,130 (FIG. 4) of the attachment member 112 facilitate such movement in the third direction, but the attachment member 112 is generally retained between the fastener shanks 158,170, as shown. Movement in the third direction typically occurs in a plane (e.g., the X-Y plane) which is substantially parallel to the horizontal X-Y plane of the base 152'. Among the movements included within this category, are movements in the directions generally indicated by arrows 224 and 226, which are generally in the Y direction (from the perspective of FIG. 5), and arrow 228, which is generally in the X direction (from the perspective of FIG. 5). Of course, it will be understood that the ends 194,196 (FIG. 4) of the test probe attachment member 112 may be moved different distances and even in different directions thus providing additional movements such as, for example, rotation of the attachment member 112 and test probe 102 about the X-axis 212, as indicated generally by the arrow 230, or about the Z-axis 214, as indicated generally by arrow 232. It will also be understood that the multi-directional freedom of movement provided by the mounting assembly 150 of the invention also includes any possible combination of the aforementioned movements and directions of movement.

Accordingly, the invention provides an improved test probe assembly 100 and an improved mounting assembly 150 to provide multi-directional freedom of movement of the test probe 102 to one of an infinite number of positions. Therefore, the invention can accommodate misalignment between the test probe 102 and the switch 4 of the DUT and substantially minimize the potential for damage to the probe 102.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A mounting assembly for an elongated test probe structured to engage a device under testing, the elongated test probe including a body, an actuator and a retractable portion, the mounting assembly comprising:
   a base; and
   at least a first resilient mount mechanically coupled to the base, the at least a first resilient mount structured to receive the test probe thereon and to generally bias the test probe away from said base, thereby being at least partially deflectable to allow movement of the test probe toward and away from the base,
   wherein, responsive to the test probe engaging the device under testing, the at least a first resilient mount is structured to establish and maintain a generally vertically aligned relationship between the test probe and the device under testing, and
   wherein, when the test probe engages the device under testing, the retractable portion of the test probe is structured to retract into the body of the test probe, thereby exposing the actuator to test the device under testing.

2. The mounting assembly of claim 1 wherein the at least a first resilient mount includes at least a first support disposed on the base and at least a first resilient element.

3. The mounting assembly of claim 2 wherein the at least a first support includes a spacer and a shoulder, the spacer being disposed on the base, and the shoulder being disposed on the spacer, the at least a first resilient element being structured to bias at least a portion of the test probe toward one of the base and the shoulder.

4. The mounting assembly of claim 3 wherein the at least a first resilient element is disposed on one of the base and the shoulder and is structured to bias the at least a portion of the test probe toward the other of the base and the shoulder.

5. The mounting assembly of claim 2 wherein the at least a first resilient element is at least a first spring structured to be disposed between the base and a portion of the test probe.

6. The mounting assembly of claim 1 wherein the device under testing is a switch; wherein the test probe is an RF probe; wherein the actuator is a wire; and wherein, when the RF probe engages the switch, the retractable portion of the of RF probe retracts into the body of the RF probe in order for the wire to engage and actuate the switch.

7. A probe assembly comprising:
   a test probe for engaging a device under testing, the test probe comprising an elongated body, an actuator, a retractable portion and an attachment member, the body being disposed on the attachment member; and
   a mounting assembly comprising:
      a base, and
      at least a first resilient mount mechanically coupled to the base, the test probe being disposed on the at least a first resilient mount, the at least a first resilient mount generally biasing the test probe away from said base, thereby being deflectable to allow movement of the test probe toward and away from the base,
      wherein, responsive to the test probe engaging the device under testing, the at least a first resilient mount establishes and maintains a generally vertically aligned relationship between the test probe and the device under testing, and
      wherein, when the test probe engages the device under testing, the retractable portion of the test probe retracts into the body of the test probe, thereby exposing the actuator to test the device under testing.

8. The probe assembly of claim 7 wherein the at least a first resilient mount includes at least a first support disposed on the base and at least a first resilient element.

9. The probe assembly of claim 8 wherein the at least a first support includes a spacer and a shoulder, the spacer being disposed on the base, and the shoulder being disposed on the spacer, the at least a first resilient element biasing at least a portion of the test probe toward one of the base and the shoulder.

10. The probe assembly of claim 9 wherein the at least a first resilient element is disposed on one of the base and the shoulder and biases the at least a portion of the test probe toward the other of the base and the shoulder.

11. The probe assembly of claim 10 wherein the at least a first support includes a first support and a second support, the first and second supports each including a spacer and a shoulder;
   wherein the attachment member of the test probe includes a first opening and a second opening; and
   wherein the spacers of the first and second supports are disposed within the first and second openings of the attachment member.

12. The probe assembly of claim 7 wherein the device under testing is a switch; wherein the test probe is an RF probe; wherein the actuator is a wire; and wherein, when the RF probe engages the switch, the retractable portion of the of RF probe retracts into the body of the RF probe in order for the wire to engage and actuate the switch.

13. A probe assembly comprising:
   a test probe for engaging a device under testing, the test probe comprising an elongated body, an actuator, a retractable portion and an attachment member, the body being disposed on the attachment member; and
   a mounting assembly comprising:
      a base, and
      at least a first resilient mount disposed on the base, the test probe being disposed on the at least a first resilient mount, the at least a first resilient mount generally biasing the test probe away from said base, thereby being deflectable to allow movement of the test probe toward and away from the base,
      wherein the base of the mounting assembly includes an oversized aperture which receives a portion of the body of the test probe to allow the multi-directional freedom of the body with respect to the base,
      wherein, responsive to the test probe engaging the device under testing, the at least a first resilient mount establishes and maintains a generally vertically aligned relationship between the test probe and the device under testing, and
      wherein, when the test probe engages the device under testing, the retractable portion of the test probe retracts into the body of the test probe, thereby exposing the actuator to test the device under testing.

14. The probe assembly of claim 13 wherein the device under testing is a switch; wherein the test probe is an RF probe; wherein the actuator is a wire; and wherein, when the RF probe engages the switch, the retractable portion of the of RF probe retracts into the body of the RF probe in order for the wire to engage and actuate the switch.

* * * * *